US006944694B2

(12) United States Patent
Pax

(10) Patent No.: US 6,944,694 B2
(45) Date of Patent: Sep. 13, 2005

(54) ROUTABILITY FOR MEMORY DEVICES

(75) Inventor: George E. Pax, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 534 days.

(21) Appl. No.: 09/903,161

(22) Filed: Jul. 11, 2001

(65) Prior Publication Data

US 2003/0014578 A1 Jan. 16, 2003

(51) Int. Cl.[7] .................................... G06F 13/00
(52) U.S. Cl. .................................... 710/107; 711/211
(58) Field of Search .................................... 365/230.02, 63, 365/189.02, 189.05, 230.06; 710/100; 257/202, 203, 692, 693; 711/211, 5, 202

(56) References Cited

U.S. PATENT DOCUMENTS

| | | | | | |
|---|---|---|---|---|---|
| 5,095,407 | A | | 3/1992 | Kanezawa et al. | |
| 5,164,916 | A | | 11/1992 | Wu et al. | |
| 5,502,621 | A | | 3/1996 | Schumacher et al. | |
| 5,579,277 | A | * | 11/1996 | Kelly | 365/230.02 |
| 5,699,315 | A | * | 12/1997 | Ko | 365/230.03 |
| 5,805,520 | A | | 9/1998 | Anglada et al. | |
| 5,808,897 | A | * | 9/1998 | Miller et al. | 716/1 |
| 5,841,686 | A | | 11/1998 | Chu et al. | |
| RE36,229 | E | * | 6/1999 | Cady | 711/211 |
| 5,941,447 | A | | 8/1999 | Chu et al. | |
| 5,950,220 | A | | 9/1999 | Quach | |
| 5,982,655 | A | * | 11/1999 | Doyle | 365/63 |
| 5,996,880 | A | | 12/1999 | Chu et al. | |
| 6,003,130 | A | | 12/1999 | Anderson | |
| 6,021,459 | A | | 2/2000 | Norman et al. | |
| 6,128,244 | A | | 10/2000 | Thompson et al. | |
| 6,161,177 | A | | 12/2000 | Anderson | |
| 6,182,213 | B1 | | 1/2001 | Klein | |
| 6,229,727 | B1 | * | 5/2001 | Doyle | 365/63 |

* cited by examiner

*Primary Examiner*—Mark H. Rinehart
*Assistant Examiner*—Clifford Knoll
(74) *Attorney, Agent, or Firm*—Dinsmore & Shohl LLP

(57) ABSTRACT

A computer system provides improved routability for memory modules. Chips are placed on the back side of the module directly behind the chips on the front side, and vias connects destination pins on the front side to the back side. Internal assignments are routed to the pins so as to be bilaterally symmetrical. These functions can include any of the pins used on the memory chip, including the address bus and the command bus. The bit positions of the internal assignments routed to pins connected together need not be identical. Where bit positions are coupled together, a remap multiplexer is used to perform rerouting of logical information onto different physical bus lines. The remap multiplexer may be implemented in the system BIOS, in the memory controller, or alternatively on the memory module. Further, the rerouting may be accomplished through any combination of hardware or software.

64 Claims, 10 Drawing Sheets

ROUTABILITY FOR MEMORY DEVICES

BACKGROUND OF THE INVENTION

The present invention relates in general to a memory system, and in particular to a memory system having improved routability.

A memory module is a memory device used by modem computer systems to provide a system memory or workspace for processors to execute programs. The system memory is in essence, a staging area between a large fixed storage medium such as a hard drive, and the central processing unil Data and programs are loaded into and out of the system memory as needed by the computer.

The demands for more memory and greater access speed are continually increasing in modern computer systems. However, the basic motherboard architecture, among other factors, limits the number of memory slots in which memory modules may be placed. The memory manufacturer is thus faced with the challenge of providing greater capacity and speed on each memory module. Surface mount technology (SMT) and double sided surface mount technology have allowed memory manufacturers to increase the number of integrated circuit chips placed on each memory module. However, the number of lead traces on the memory module required to interconnect the chips increases as the number of integrated circuit chips increase. Additionally, increasing the storage capacity of each memory chip requires additional external pin connections per memory chip to account for the additional data and address bus widths. These increases further add to the number of lead traces required on a memory module. As circuit speed increases, the distributed capacitance and inductance over the length of each lead trace on a memory module causes it to act like a transmission line. Further, crosstalk may become a limiting factor to memory performance due to mutual inductance or capacitance, and can cause a loss of signal strength in the active line.

SUMMARY OF THE INVENTION

The present invention overcomes the disadvantages of previously known memory systems for computers by providing a memory module configuration where memory chips are placed on both the front side and back side of a substrate defining the memory module. The chips on the back side of the module are preferably placed directly behind the chips on the front side of the memory module, and certain pins from the top and bottom chips are connected by vias. For example, the chips on the memory module are constrcted such that internal assignments for like functions are routed to external pins in a bilaterally symmetrical arrangement. The bilateral symmetry can be applied to any of the memory chip functions, including the address bus and the command bus. A remap multiplexer is used to ensure that the correct logical data is placed on the proper physical bus line. The remap multiplexer may be implemented through any combination of hardware or software, and may be integrated into the system BIOS, the memory controller, or the memory chips. The remap multiplexer may also be implemented as an element between the memory controller and memory chips, such as buffer, registers, or switches.

For a more detailed understanding of the nature and advantages of the present invention, reference should be made to the following detailed description taken together with the accompanying figures.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals, and in which.

DETAILED DESCRIPTION OF THE PREFERRED EMBODIMENTS

In the following detailed description of the preferred embodiments, reference is made to the accompanying drawings that form a part hereof, and in which is shown by way of illustration and not by way of limitation, specific preferred embodiments in which the invention may be practiced. It is to be understood that other embodiments may be utilized and that logical, mechanical and electrical changes may be made without departing from the spirit and scope of the present invention.

Figure 1:
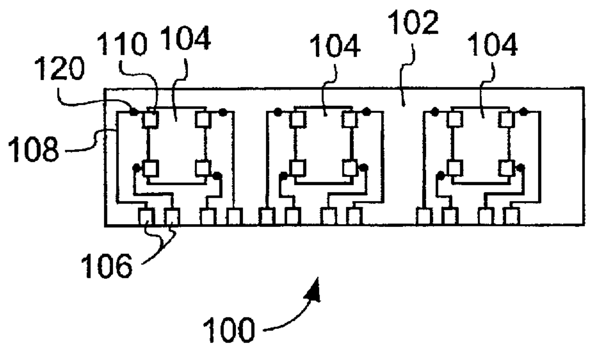
FIG. 1 is a side view of a memory module according to the present invention, illustrating a plurality of memory chips positioned along a major surface of a memory module substrate.

As shown in FIG. 1, a memory module 100 includes a wireboard substrate 102 holding a plurality of memory chips 104. The circuit chips 104 may be any type of memory device as is known in the art. Further, the memory circuitry can be packaged in any circuit package as is known in the art. A plurality of system bus connectors 106 aligns along one edge of the wireboard substrate 102. Circuit traces 108 couple the system bus connectors 106 to corresponding pins 110 of each of the memory chips 104. Each memory chip 104 is shown in FIG. 1 as having only four pins 110 for simplicity, however any number of pins 110 may be provided, and will depend upon the size and type of memory chip used. Each of the pins 110 of memory chip 104 has a particular pin assignment that corresponds to an internal processing function. The pin assignments are internal to the chip and represent coupling the circuitry of the memory chip to external contacts. The pin assignment represents the type of data the internal memory circuit is expecting on the external pin connections. For example, pins 110 may have pin assignments that correspond to a particular bit position of an address or data I/O bus internal to the chip. AJternatively, the pins 110 may correspond to pin assignments for routing external control signals to corresponding internal control functions of the memory chip 104. The pins 110 may also provide power, ground or alternatively have no internal pin assignment.

The number of memory chips 104 on a memory module 100, and the number of pins 110 per memory chip 104 can be limiting factors because of problems associated with increased density of circuit traces 108, and the limited space available for system bus connectors 106. Further, capacitance and inductance effects along each trace 108 may detriment the overall performance of the memory module 100. Reducing the density of circuit traces 108 may reduce capacitive and inductive effects, as well as minimize problems such as crosstalk, excessive power consumption and other adverse performance characteristics.

Figure 2:
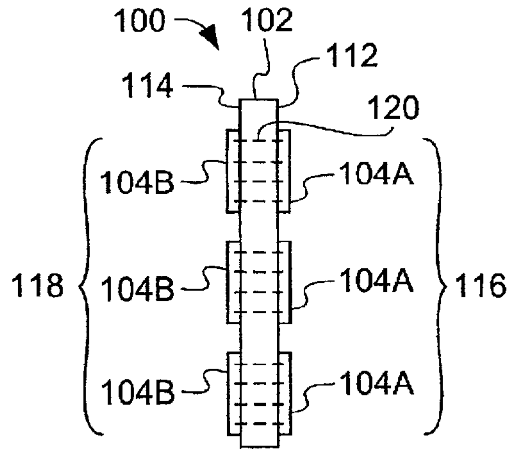
FIG. 2 is a top view of the memory module of FIG. 1.

Referring to FIG. 2, the memory module 100 is seen from a view along the top edge of the wireboard substrate 102. The wireboard substrate 102 has a first major surface 112 and a second major surface 114. The memory chips on the first major surface 112 are designated 104A and the memory chips mounted to the second major surface 114 are designated as 104B. The memory chips 104A positioned on the first major surface 112 define a first memory bank 116 (BANK A), and the memory chips 104B positioned on the second major surface 114 define a second memory bank 118 (BANK B).

The memory chips 104A, 104B may be mounted to the wireboard substrate 102 using surface mount technology or other techniques as are known in the art. Further, it should be appreciated that each memory chip 104A, 104B may use any number of internal banks, arrays or other configurations to store and retrieve data as is known in the art. Also, to facilitate an understanding of the present invention, and for clarity, the memory chips 104A are shown on the first major surface 112, and the memory chips 104B are shown on the second major surface 114. However, it shall be appreciated that the present invention is equally applicable to memory chips including memory banks interleaved from side to side as is known in the art.

Circuit traces 108 (not shown in FIG. 2) are reduced by aligning memory chips 104A on the first major surface 112 in register with, or directly in line with memory chips 1048 on the second major surface 114. The memory module 100 further includes a plurality of vias 120. Each via is electrically coupled to, and positioned adjacent to a pin 110 on the first major surface 112 (best illustrated in FIG. 1). The via 120 further couples to a pin 110 on the second major surface 114 adjacent to the via 120 and in register with the corresponding pin 10 on the first major surface 112. Such a construction minimizes circuit traces 108, and allows routing options that are not otherwise possible because the density of circuit traces 108 is reduced.

To minimize cost of inventorying and stocking memory chips, the memory module 100 is constructed with identical memory chips 104A, 104B on both the first major surface 112 and the second major surface 114. The memory chips 104A, 104B include pin assignments that are grouped together and internally coupled to pins 110 (not shown in FIG. 2) in a manner so as to be bilaterally symmetrical as explained below.

Figure 3:
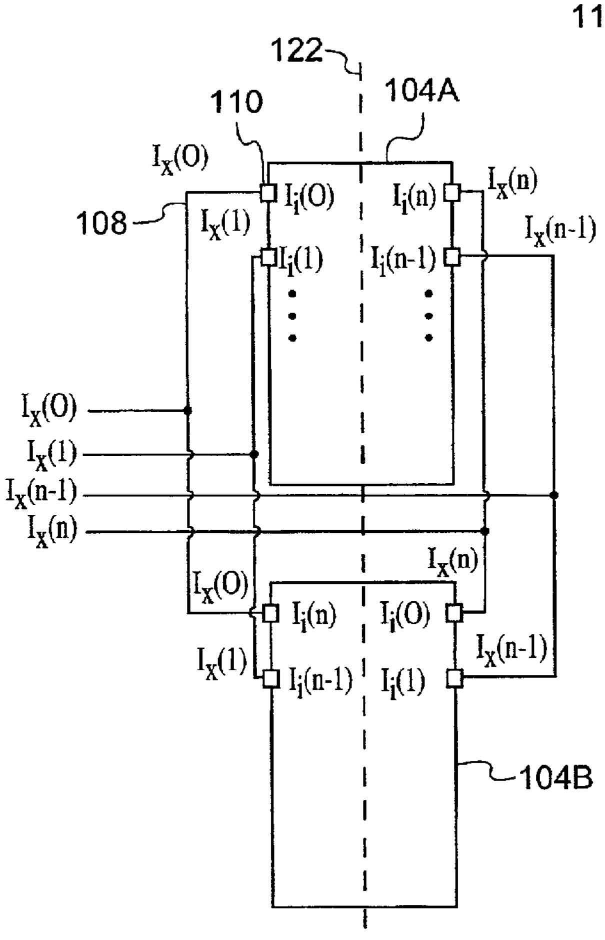
FIG. 3 is a schematic diagram illustrating the physical connections between circuit traces on the memory module substrate and corresponding pin assignments of two memory chips, where the two memory chips are positioned on opposite sides of the memory module.

Referring to FIG. 3, each memory chip 104A, 104B has pin assignments for like functions coupled to pins 110 that are arranged bilaterally symmetrical along axis 122. As illustrated in FIG. 3, pins 110 are coupled to pin assignments $I_i(\mathbf{0})$ to $I_i(n)$. The "i" subscript as used herein indicates that the assignment is internal to the memory chip 104A, 104B. Pin assignments $I_i(\mathbf{0})$ to $I_i(n)$ represent internal assignments for an address or command bus as more fully explained herein. Each pin assignment coupled to a pin 110 represents a single bit position of a data path consisting of n+1 total bits. The memory chips 104A, 104B are coupled to circuit traces 108 carrying information $I_x(\mathbf{0})$ to $I_x(n)$. The circuit traces 108 couple to corresponding bus line assignments via the system bus connectors (not shown in FIG. 3). The "x" subscript as used herein indicates that the assignment is external to the memory chip 104A, 104B.

The pins 110 of memory chip 104A couple to the circuit traces 108 in a manner such that the assignment of the circuit traces 108 external to the pins 110, that is $I_x(\mathbf{0})$ to $I_x(n)$, correspond to the identical internal pin assignment $I_i(\mathbf{0})$ to $I_i(n)$. That is, $I_x(\mathbf{0})$ couples to $I_i(\mathbf{0})$, $I_x(\mathbf{1})$ couples to $I_i(\mathbf{1})$ etc. all of the way around the chip 104A. However, because the corresponding chip 104B is connected to the circuit traces 108 on the reverse side of the wireboard substrate 102 (not shown in FIG. 3), the internal and external assignments will not correspond to identical bit positions. Rather, as illustrated in FIG. 3, $I_x(\mathbf{0})$ couples to $I_i(n)$, $I_x(\mathbf{1})$ couples to $I_i(n-1)$ etc. However, because all of the pins 110 couple to a like pin assignment function, that is, the signal on each pin assignment are all bits of the address or command buses respectively, the correct information can be received by either memory chip 104A or 104B by rerouting the logical infornation placed on the physical line or circuit trace 108. In other words, the logical information can be moved to a different physical circuit trace 108 so that the internal pin assignments receive the correct information regardless of whether the correct external assignment corresponding to a particular circuit trace is used. It shall be noted that for the purpose of this invention, the address and command pins are sufficiently alike that they can be interchanged.

For example, in the memory module shown in FIGS. 1–3, a bit of information that corresponds to bit position $I_i(\mathbf{0})$ is multiplexed to the physical circuit trace 108 that corresponds with external assignment $I_x(\mathbf{0})$ when accessing memory chip 104A, however that same bit position $I_i(\mathbf{0})$ is multiplexed to the physical circuit trace 108 that corresponds with the external assignment $I_x(n)$ when accessing the memory chip 104B. This technique allows the exact same memory chip 104A, 104B to be used on either side of the wireboard substrate, and thus reduces inventory costs and other related concerns. Further, because fewer stubs are required, higher bus speeds are inherently supported because capacitance and transmission effects are reduced.

It should be appreciated that for each pair of memory chips 104A, 1048 aligned in register with one another, their internal pin assignments will be mirrored bilaterally. The vias 120 that connect pins 110 should be used where the pins 110 on the memory chips 104A, 104B correspond to the same function. Thus a via 120 may connect non-identical pin assignments so long as each pin assignment is from the same function. Correspondingly, for the command bus, the pin assignments may consist of signals responsible for selecting and controlling each memory chip 104A, 104B. The exact types of command signals will vary depending upon the memory architecture implemented on the memory chip, however, examples of command signals include chip select signals RAS, CAS, and write enable WE pin assignments. The pin assignments need not align in any specific order sequence. Further, vias 120 need not be used where like functions cannot be aligned, or are unnecessary. For example, the power Vcc and ground Gnd for a memory chips 104A and 104B need not be mirrored where the power and ground are distributed through a layer in the wireboard substrate 102. It shall be appreciated that the present invention thus allows for a reduced via count and greater trace separation.

Where a via connects pin assignments of similar function but different bit position or command function, care must be taken to make sure the correct functions are placed on the circuit traces 108 and coupled to the corresponding memory chips 104A or 104B. Arranging for the correct function to appear on an associated circuit trace 108 can be accomplished in any number of ways. By way of illustration, and not limitation, a few ways will now be discussed.

The BIOS Enabled Memory Reroute

Figure 4:
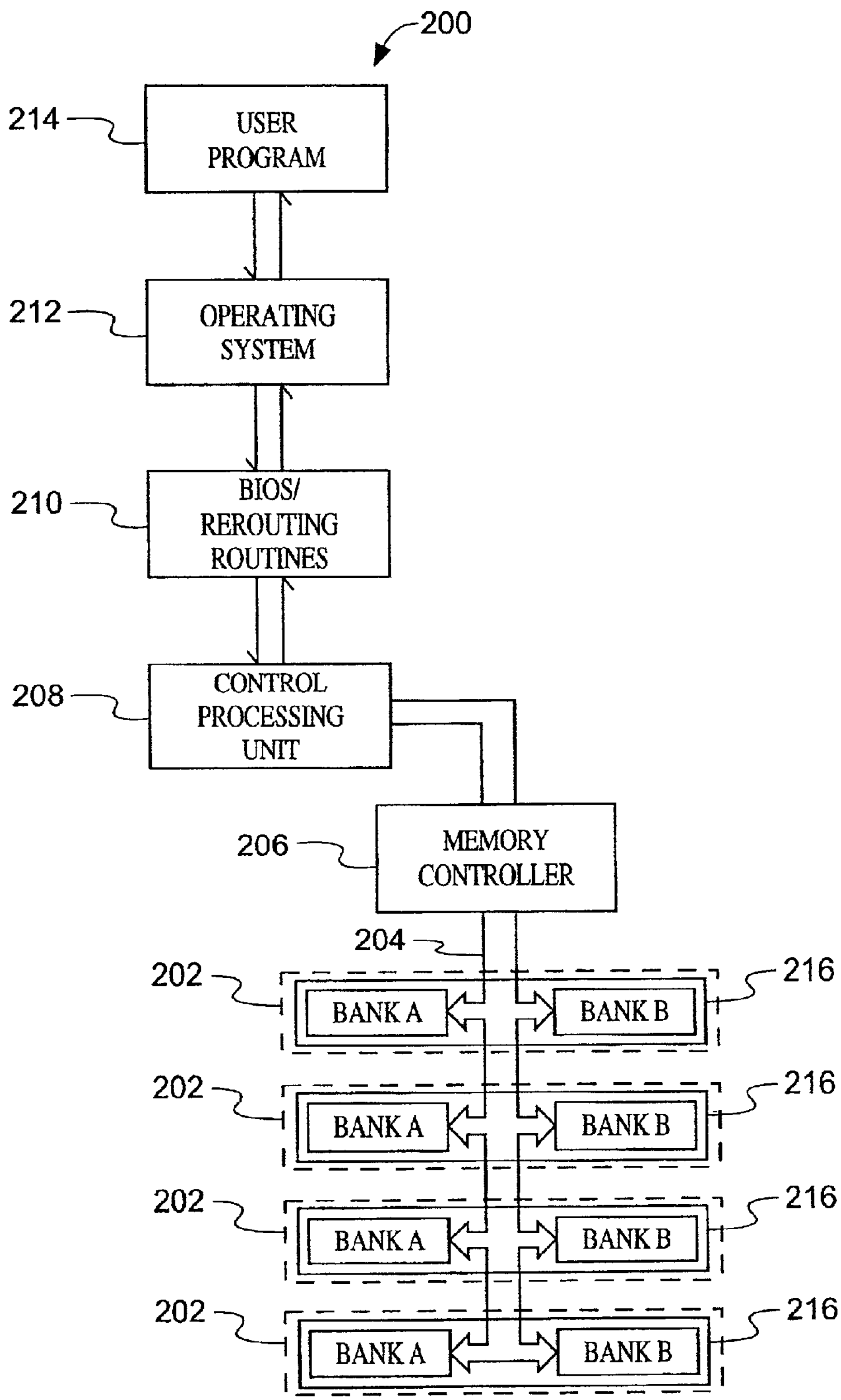
FIG. 4 is a flow diagram illustrating a hierarchy of program execution on a computer system according to one embodiment of the present invention where bus assignments are rerouted using the basic input output system program.

Referring to FIG. 4, a computer system 200 indudes four memory slots 202. Each memory slot 202 is capable of supporting a memory module 216. The memory modules 216 are identical to those memory modules discussed with reference to FIGS. 1–3. The memory slots 202 are connected in parallel to a system bus 204, which also interconnects the memory slots 202 to a memory controller 206 and central processing unit (CPU) 208. It should be observed that the system bus 204 is comprised of a plurality of system bus lines, each line carrying one bit of logical data. The number of system bus lines, or bus width will depend upon the types of memory used, as well as the design and implementation of the CPU 208. Further, the system bus 204 may actually comprise several buses including an address bus, a data bus, and/or a command bus.

When the computer system 200 boots up, a basic input output system program 210 (BIOS) is loaded and executed by the CPU 208. The BIOS provides hardware level access to devices in the computer system 200, including access to the memory modules 216 seated in the memory slots 202. The BIOS interacts with the computer operating system 212 and the CPU 208 to store and retrieve information from memory. The operating system 212 provides a common interface for user programs 214 to access the memory modules 216 without the need to worry about the specifics of the BIOS 210, or memory controller 206, Thus, a user program 214 issues a request to the operating system 210, to retrieve or store a piece of information. The operating system 212 communicates with the BIOS 210 to ensure that the CPU 208 saves or retrieves the correct data in the correct address location. The BIOS 210 includes program routines to remap the address and command if the assignments of the system bus lines do not align in correspondence with the associated internal pin assignments of the memory module 100.

For example, a memory module 216 having a first bank (BANK A) and a second bank (BANK B) is inserted in to each memory slot 202. The second bank has internal pin assignments that mirror pin assignments of the first bank, such as memory modules described with reference to FIGS. 1–3. The operating system 212 passes information to the BIOS 210. The BIOS 210 instructs the central processing unit 208 to place or retrieve the information on/from the system bus 204, where the respective bit positions of the information are mapped to a first pattern corresponding with pin assignments of the memory chips in BANK A, when accessing that memory bank. The same information is mapped to a second pattern corresponding to pin assignments of the memory chips in BANK B when accessing that memory bank. Utilizing the memory modules illustrated in FIGS. 1–3, if the information is to intended for BANK A, the pin assignments already correspond with the assignments placed on the physical system bus 204, so the first pattern corresponds with the logical arrangement of the system bus lines. The BIOS 210 does not need to remap the information. If however, the CPU 208 is accessing BANK B, then the BIOS 210 maps the information to the second pattern. The second pattern may be generated for example, by swapping various bit positions of the information. For a memory module described with reference to FIGS. 1–3, the second pattern may be constructed by swapping the logical values in bit positions $I_x(\mathbf{0})$ with $I_x(n)$, $I_x(1)$ with $I_x(n-1)$ etc. Again the "x" subscript is used to designate information external to the memory chips. After the bit swaps, the value representing the logical bit position $I_x(\mathbf{0})$ will actually be placed on the physical system bus line $I_x(n)$ but will be received by the correct internal pin assignment $I_i(x)$ of the memory chip. This analysis applies whether the information is placed on the system bus 204 corresponds to the command bus, and/or address bus.

The Hardware Enabled Memory Reroute

Figure 5:
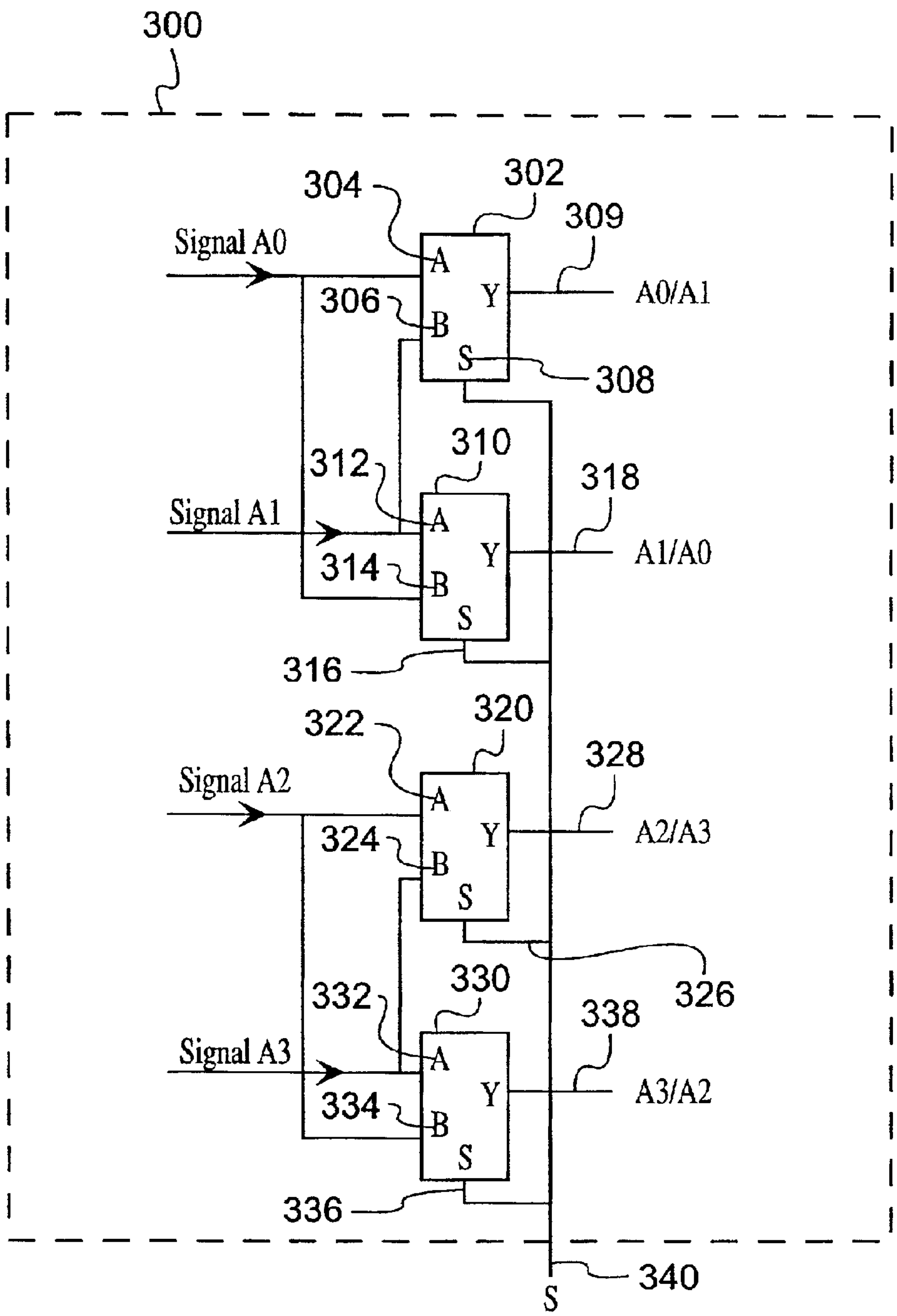
FIG. 5 is a schematic diagram illustrating the use of multiplexers to build a remap multiplexer according to another embodiment of the present invention.

The reroute of memory information may also be handled by hardware as illustrated in FIG. 5. A reroute multiplexer 300 is used to transfer a logical signal appearing on a first physical line, to a separate physical line. This is accomplished schematically using one or more multiplexers. The term multiplexer (MUX) as used herein means any hardware, software or combination of hardware and software that is used to select an output from more than one input, or alternatively, to switch an input between two or more outputs. For example, the MUX may be a transistor switching circuit, implemented as a logic device or any other technique for performing the operation.

As shown in FIG. 5, the reroute multiplexer 300 comprises a first multiplexer 302 having first and second inputs 304, 306, a switching control input 308 and an output 309. The second multiplexer 310 has first and second inputs 312, 314, a switching control input 316 and an output 318. The third multiplexer 320 has first and second inputs 322, 324, a control switching input 326 and an output 328. Likewise, the fourth multiplexer has first and second inputs 332, 334, a switching control input 326 and an output 328. A first signal A0 couples to the first input 304 of the first multiplexer 302 and to the second input 314 of the second multiplexer 310. In complementary fashion, a second signal A1 couples to the second input 306 of the first multiplexer 302 and to the first input 312 of the second multiplexer 310. A third signal A2 couples to the first input 322 of the third multiplexer 320 and to the second input 324 of the fourth multiplexer 330. In complementary fashion, a fourth input A3 couples to the second input 324 of the third multiplexer 320, and to the first input 332 of the fourth multiplexer 330. A single control signal (S) 340 couples to the switching control inputs 308, 316, 326 and 336 of all four multiplexers 302, 310, 320 and 330.

When the control signal (S) 340 is in a first state, each multiplexer is configured to pass the first input to the output, thus A0 appears across output 309, A1 appears across output 318, A2 appears across output 328 and A3 appears across 338. However, when the control signal (S) 340 is in a second state, each multiplexer switches so that A1 appears across output 309, A0 appears across output 318, A3 appears across output 328 and A2 appears across output 338. It should be appreciated that other multiplexing schemes can be used with any degree of sophistication. Further, it should be appreciated that any number of multiplexers may be used depending upon the number of lines to be multiplexed. Further, this circuit may be used to multiplex the address bus, command bus, and/or the data bus. Finally, it should be appreciated that this circuit may be placed anywhere in the bus path.

Figure 6:
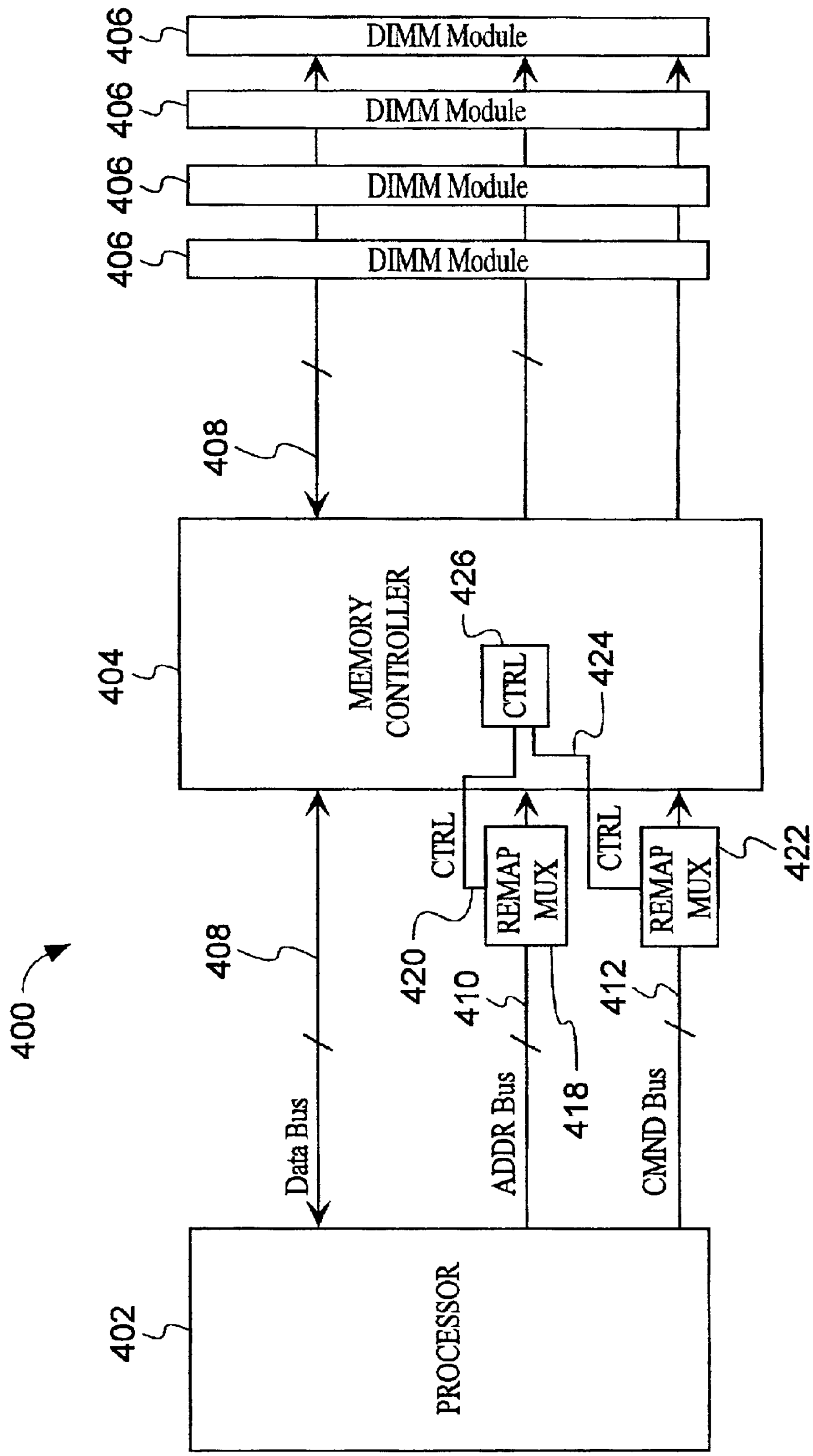
FIG. 6 is a block diagram illustrating the use of the remap multiplexer of FIG. 5 to reroute bus assignments according to another embodiment of the present invention, where the remap multiplexer is positioned between a memory controller and a processor.

Referring to FIG. 6, the computer system 400 includes a processor 402 coupled to a memory controller 404 and a plurality of memory modules 406 by data bus 408, address bus 410 and command bus 412. The computer system 400 further includes a remap multiplexer 418 coupled to the address bus 410 and positioned between the processor 402 and the memory controller 404. The memory controller 404 controls the remap multiplexer 418 via the control signal 420. A remap multiplexer 422 is coupled to the command bus and positioned between the processor 402 and the memory controller 404. The memory controller 404 controls the remap multiplexer 422 via control signal 424. For example, the memory controller may use a remap multiplexer controller 426 for controlling the control signals 420 and 424. The remap multiplexer controller 426 may be implemented as any circuit, combinational logic, software or similar construction. For example, the memory controller 404 usually generates a chip select, bank select or other similar control signal for enabling access to a particular memory location. Such a control signal may be utilized to effect control signals 416, 420, and 424. Other more sophisticated circuits are also possible, and their designs will depend upon the memory configuration it shall be observed that a remap multiplexer need not be included on each bus.

Figure 7:
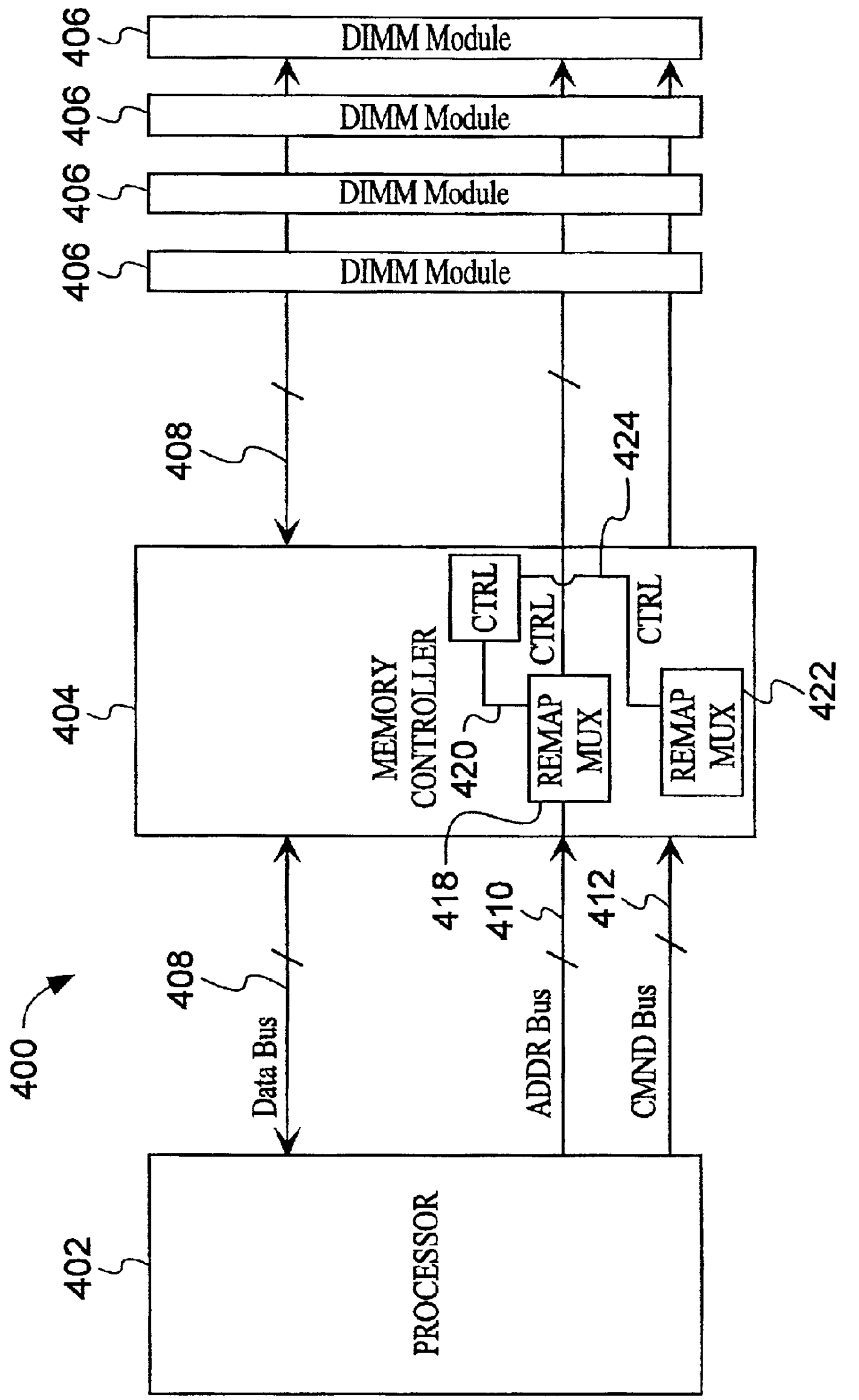
FIG. 7 is a block diagram illustrating the use of the remap multiplexer of FIG. 5 to reroute bus assignments according to another embodiment of the present invention, where the remap multiplexer forms a component part of the memory controller.
Figure 8:
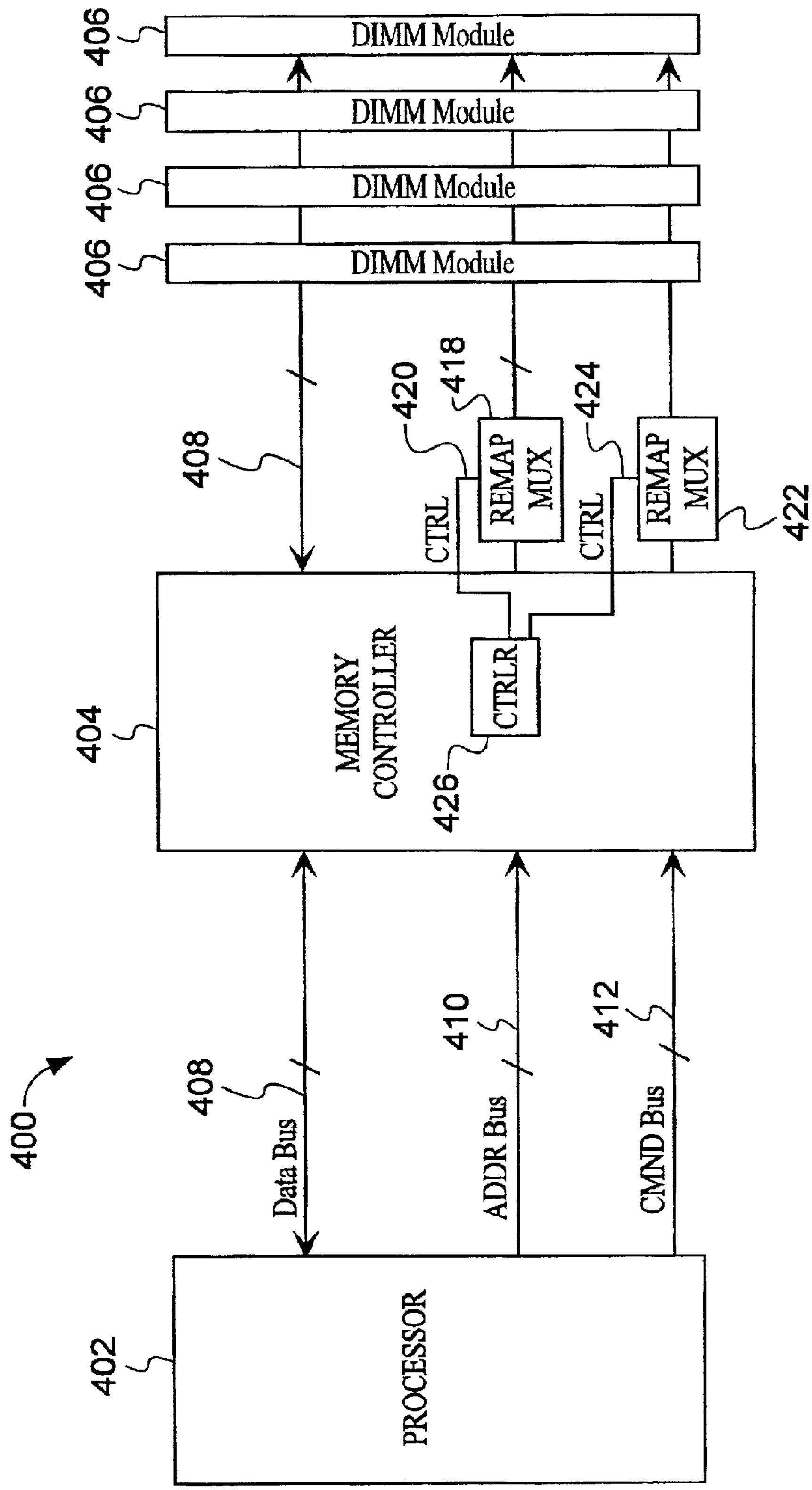
FIG. 8 is a block diagram illustrating the use of the remap multiplexer of FIG. 5 to reroute bus assignments according to another embodiment of the present invention, where the remap multiplexer is positioned between a memory controller and one or more memory modules, including where the remap multiplexer is incorporated into the output stage of the memory controller, physically positioned between the memory controller and memory modules, or resident on each memory module.

Referring to FIGS. 7 and 8, the computer systems are identical to that described in FIG. 6, and as such, like reference numerals are used. The only difference is that the remap multiplexers 418 and 422 are an integral component of the memory controller 404 in FIG. 7. For example, the remap multiplexer 418 coupled to the address bus 410, may be combined into the memory interface (not shown) or similar logic. The remap multiplexers 418 and 422 are positioned between the memory controller 404 and memory modules 406 in FIG. 8. It shall be observed that the remap multiplexers 418 and 422 as shown in FIG. 8 may be incorporated into the output stage of the memory controller 404, may be positioned physically somewhere between the memory controller 404 and mnemory modules 406, or may reside on each memory module 406.

Figure 9:
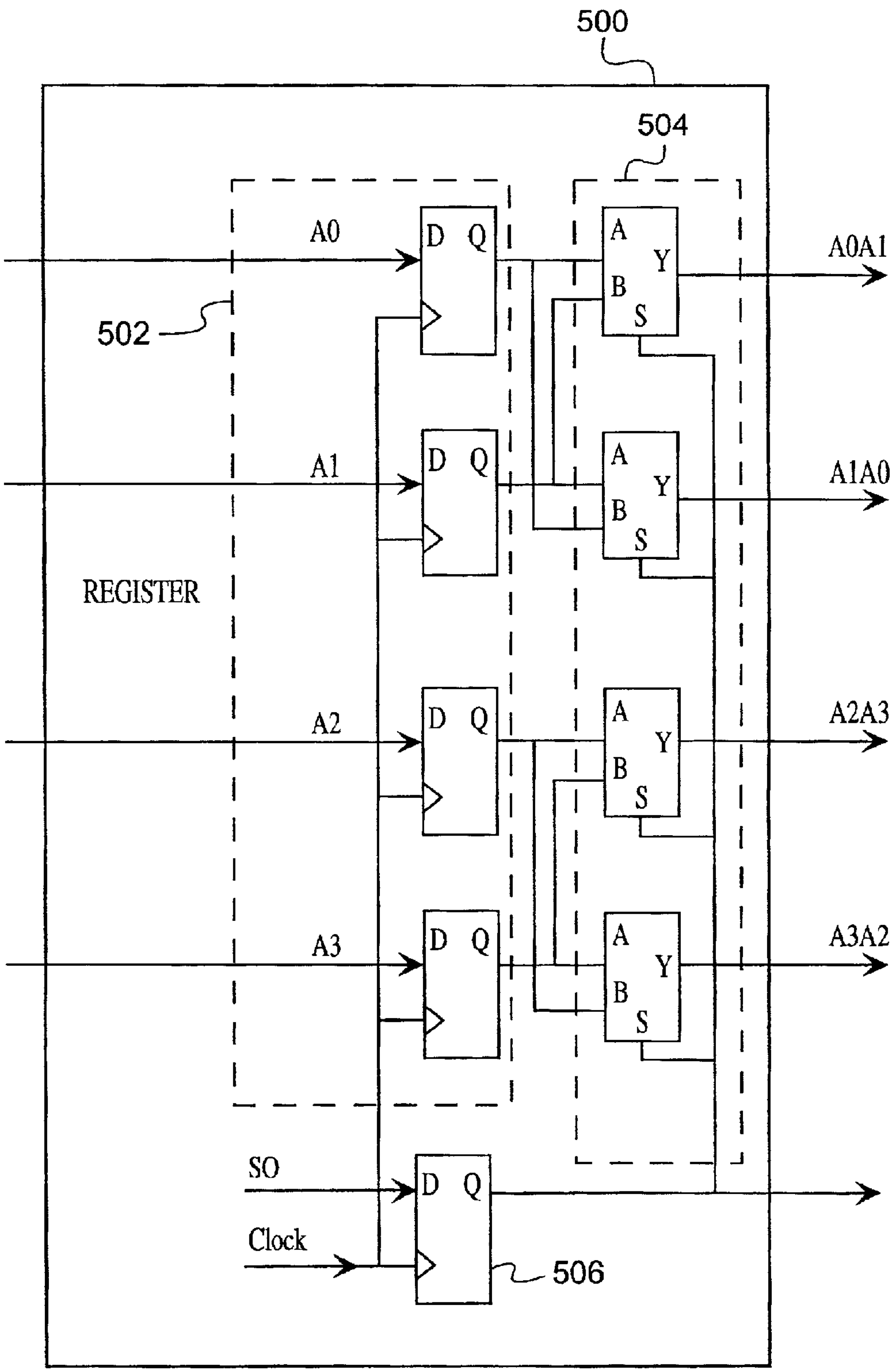
FIG. 9 is an schematic diagram illustrating the use of multiplexers to build a remap multiplexer according to another embodiment of the present invention, where the remap multiplexer is a component part of a memory module having a buffer register, the remap multiplexer multiplexing the buffer outputs.

Some memory modules utilize buffers or registers to drive the address and command buses as is known in the art. As shown in FIG. 9, a memory module 500 includes an address register or buffer 502. Buffers are known to introduce latency into the bus, but provide a buffering function to reduce the load seen by the memory controller. The address register 502 has sufficient current capabilities to drive the memory chips (not shown). Although only four address lines are shown, it should be appreciated that any number of address lines may be registered or buffered. Further, while described with reference to the address bus, it shall be appreciated that the command bus may utilize similar registers.

The circuit implementing the address registers 502 is not limited to the use of an array of D flip flops as illustrated in FIG. 9, rather any buffer may be used as is known in the art. The memory module 500 includes a remap mufltiplexer 504. The remap multiplexer 504 functions identically to that described herein. The memory module 500 passes an address on the address bus and generates a bank select signal S0. A clock signal latches the bank select signal S0 into a remap multiplexer switching control 506, and concomitantly latches the address (lines A0, A1, A2, A3) into the address register 502. While bank select signal S0 is a convenient signal to use in this application, other logic may be used. Lines A0, A1, A2, A3 output from the address register 502 are inputted into the remap multiplexer 504. Similarly, the latched output of the switching control 506 drives the switching control inputs of each multiplexer in the remap multiplexer 504. Thus the bank select signal S0 is used to toggle the remap multiplexer 504 between first and second states as described herein.

Figure 10:
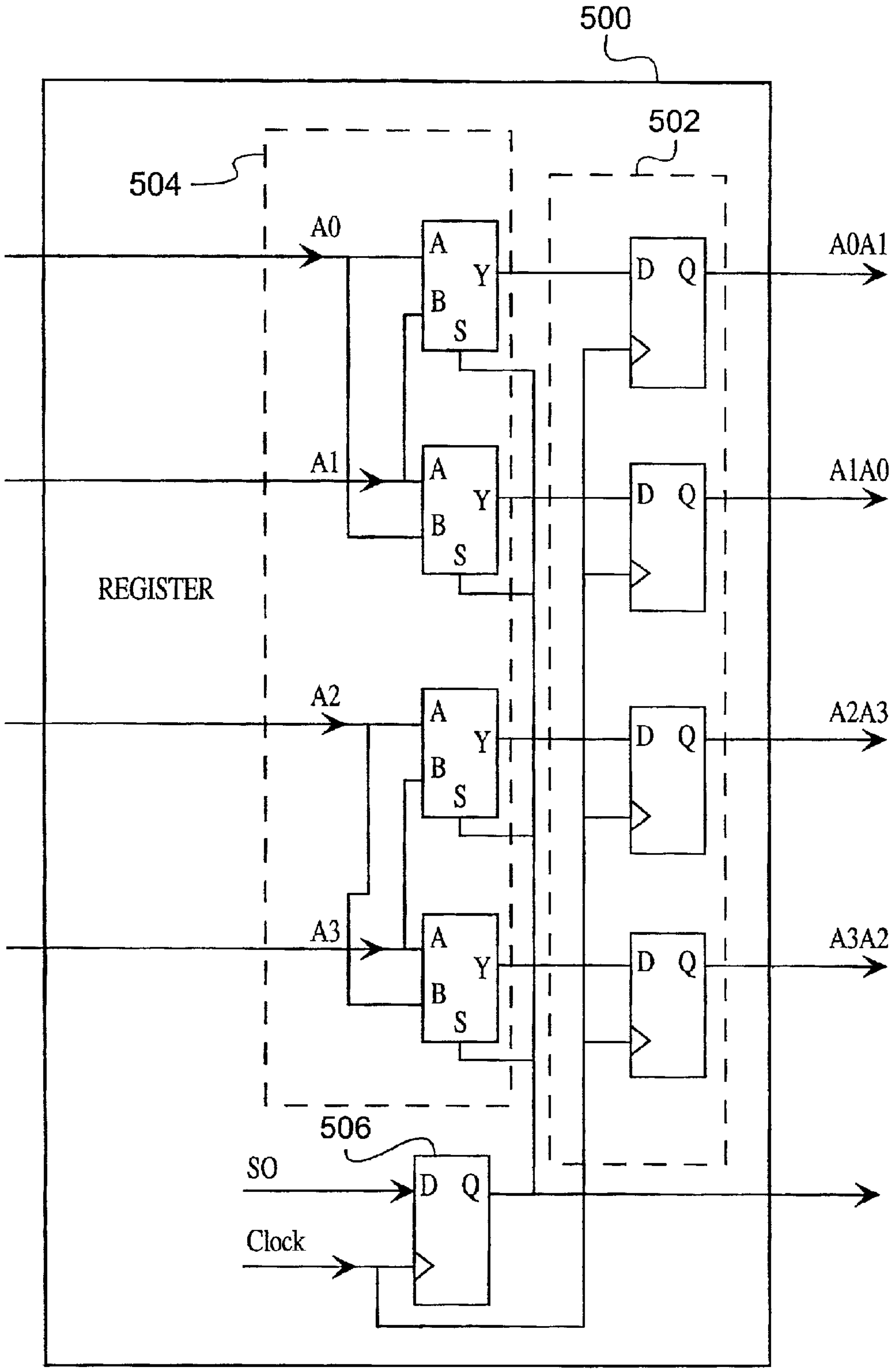
FIG. 10 is an schematic diagram illustrating the use of multiplexers to build a remap multiplexer according to another embodiment of the present invention, where the remap muliplexer is a component part of a memory controller having a buffer register, the remap multiplexer multipexing the buffer inputs.

Referring to FIG. 10, the memory module 500 is similar to that described in FIG. 9 except that the lines A0, A1, A2 and A3 are fed into the remap multiplexer 504 and the output lines of the remap multiplexer 504 are latched into the address register 502. Although the remap multiplexer 504 is placed before the inputs to the address register 502, the bank select signal S0 is still latched into the switching control 506 and the latched output is used to drive the switching control inputs of the remap multiplexer 504.

The On-Chip Chip Memory Reroute

Figure 11:
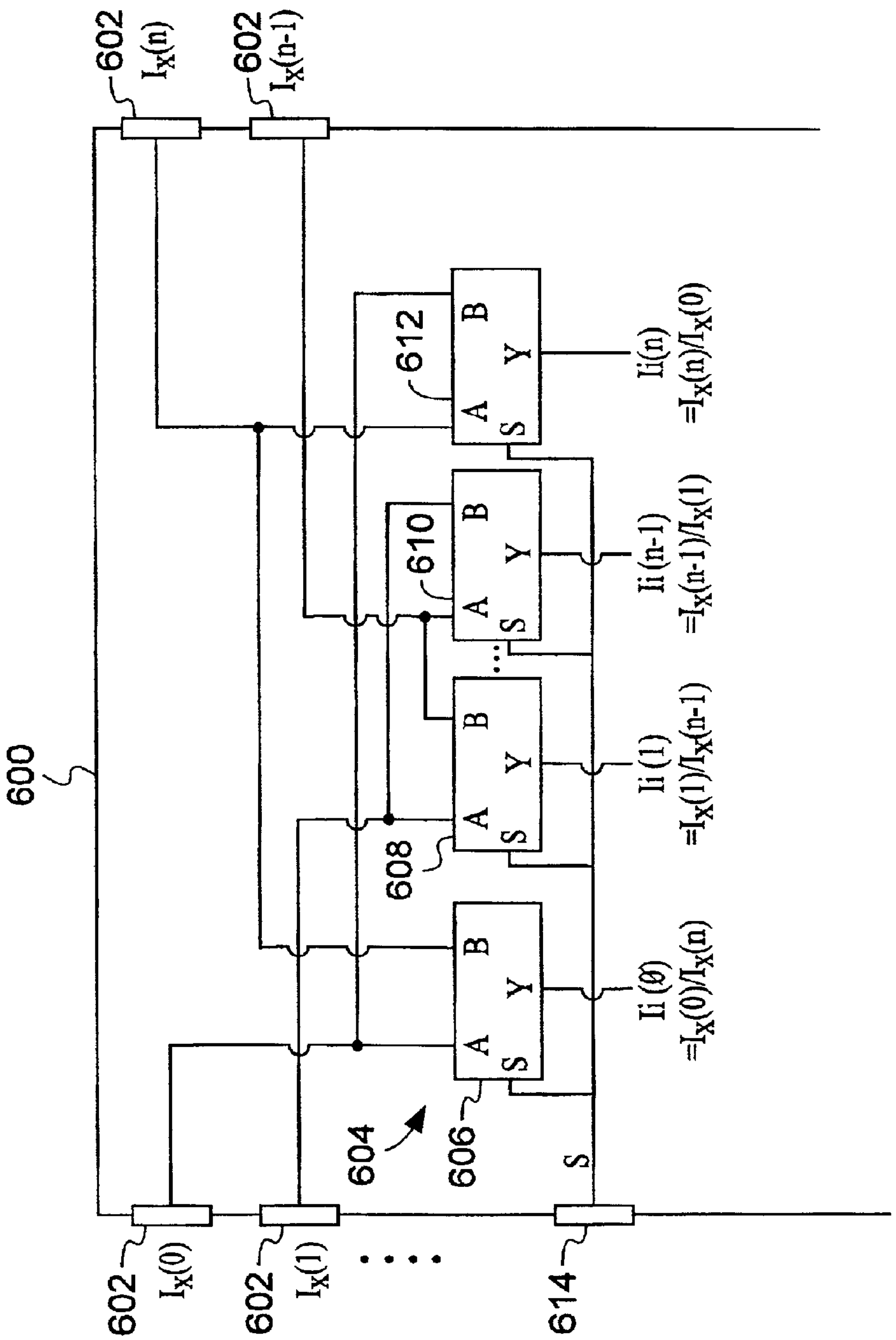
FIG. 11 is an illustration of a pin reroute function built into a memory chip where the rerouting function is implemented by a remap multiplexer and controlled by an external signal; and, FIG. 12 is an illustration of a pin reroute function built into a memory chip where the rerouting function is implemented by a remap multiplexer and controlled by logic internal to the chip.

The remap multiplexer described herein and specifically with reference to FIG. 5 can be implemented within each memory chip installed on the memory module. Referring to FIG. 11, a memory chip 600 includes a plurality of contacts 602 for connecting external signals $I_x(0)$, $I_x(1)$ . . . $I_x(n-1)$ and $I_x(n)$ to the internal circuitry of the memory chip 600. The internal signals couple through remap multiplexer 604 before reaching their respective internal assignments $I_i(0)$, $I_i(1)$ . . . $I_i(n-1$ $I_i(n)$. The remap multiplexer includes a plurality of multiplexers 606, 608, 610 and 612 as illustrated. It should be appreciated that the number of remap multiplexers can vary. Two multiplexers are used for each pin swap.

As illustrated in FIG. 11, physical lines $I_x(0)$ and $I_x(n)$ couple to bilaterally symmetric contacts 602 of the memory chip 600. Physical lines $I_x(0)$ and $I_x(n)$ are coupled to multiplexers 606 and 612 in complementary fashion. The output Y of the multiplexer 606 couples to internal assignment $I_i(0)$. The logical value appearing on the internal assignment $I_i(0)$ will be the logical value appearing on physical external line $I_x(0)$ when the control signal S of multiplexer 606 is in a first state, and the logical value appearing on the external line $I_x(n)$ when the control signal S of the multiplexer 606 is in a second state. Correspondingly, the output Y of the multiplexer 612 couples to internal assignment $I_i(n)$. The logical value appearing on the internal assignment $I_i(n)$ will be the logical value appearing on physical external line $I_x(n)$ when the control signal S of multiplexer 612 is in a first state, and the logical value appearing on the external line $I_x(\mathbf{0})$ when the control signal S of the multiplexer 612 is in a second state. The control signal S of each multiplexer 606 and 612 is tied to the same source, so the logical value appearing on internal assignments $I_i(\mathbf{0})$ and $I_i(n)$ will come from complementary and bilaterally symmetric external lines $I_x(\mathbf{0})$ and $I_x(n)$. This analysis applies to every pair of bilaterally symmetric pin assignments that are routed through the remap multiplexer 604.

It shall be observed that the specifics of a particular application will dictate whether or not bilaterally symmetric pins must correspond to the same function. For example, as illustrated in FIg. 11, it makes no difference whether the external assignments correspond to the address or command buses, however the bilaterally symmetric pins will generally correspond to the sane function. In other words, they should each be from the address bus or command bus. It does not matter however, what bit positions within a like function are programmable.

Each of the control signals S of the multiplexers 606, 608, 610 and 612 are linked together so that all the multiplexers 606, 608, 610 and 612 are in the same state, and may be tied to an external control pin 614. The control pin 614 may be coupled to any external signal for programming the states of the multiplexers 606, 608, 610 and 612. For example, the control pin 614 may be tied to a controlling device on the memory module, or alternatively, the control pin 614 may be tied to the memory controller.

Figure 12:
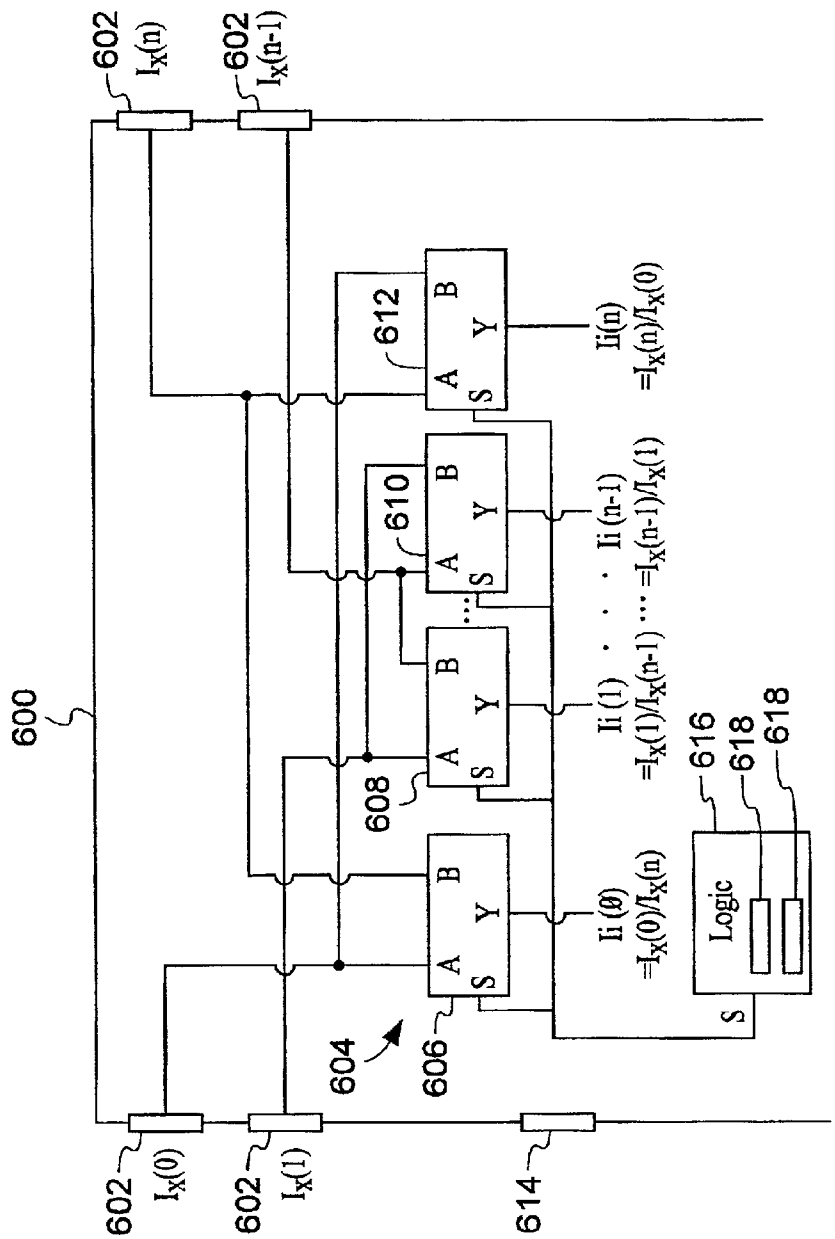

Referring to FIG. 12, the memory chip 600 is identical to that described with reference to FIG. 11 with the exception that the external control pin 614 of FIG. 11 is replaced with internal logic 616. The internal logic can be any logic capable of performing the switching operation. For example, a circuit built around the chip select or equivalent signal can be used. Further, in the case of SDRAM, some synchronous DRAM, or other memory technologies that include programmable mode registers 618, the internal logic 616 may be incorporated into such programmable mode registers 618.

For example, at power up, the SDRAM is supplied with an operating voltage of Vcc. The operating voltage Vcc typically rises from 0 Volts to about 3 Volts. As Vcc is rising, control logic circuitry in the memory device generates a power up pulse. The power up pulse is a single shot pulse. The pulse is held high long enough to allow the control signal S of each multiplexer defining the remap multiplexer 604 to be latched into either the first or second state. While this method works well during a cold boot, or power up condition, there are times when the memory circuit is reset by a warm boot. When a cold or warm boot occurs, the mode registers 618 may be properly initialized. In response to a load mode register command (LMR), a reset pulse (LMR pulse) is generated. The LMR command causes an LMR pulse to be generated by a control module within the memory chip. During the LMR signal, the various mode registers are programmed with data from the address bus as is known in the art. Data loaded into one or more bits of the mode registers 618 may be used to control the remap multiplexer 614 by supplying a control signal that assigns the remap multiplexer 614 into either the first or second state.

Having described the invention in detail and by reference to preferred embodiments thereof, it will be apparent that modifications and variations are possible without departing from the scope of the invention defined in the appended claims.

What is claimed is:

1. A computer system comprising:

a central processing unit;

a memory module, said memory module comprising a first memory bank of substantially identical memory chips, a second memory bank of substantially identical memory chips, and a plurality of system bus connectors, said first and second memory banks each comprising a plurality of pin assignments, one pin assignment from each said first and second memory banks coupled to an associated one of said plurality of system bus connectors, wherein at least one of said plurality of bus connectors is coupled to non-identical pin assignments of said first and second memory banks, wherein said non-identical pin assignments have internal assignments for like functions in a bilaterally symmetrical aarrangement; and, a system bus coupling said central processing unit to said plurality of system bus connectors of said memory module, wherein said central processing unit places information on said system bus mapped to a first pattern corresponding with said pin assignments of said first memory bank when accessing said first memory bank, and said information mapped to a second pattern corresponding with said pin assignments of said second memory bank when accessing said second memory bank.

2. A computer system according to claim 1, wherein said central processing unit further comprises a basic input output system program and a processor, said processor executing said basic input output system program, wherein said processor places said information on said system bus, said information arranged by said basic input output system in said first pattern when accessing said first memory bank, and in said second pattern when accessing said second memory bank.

3. A computer system according to claim 2, further comprising an operating system loaded into said memory device and executed by said processor, said operating system arranged to communicate information to said basic input output system, wherein said basic input output system arranges said information in a first pattern when said processor accesses said first memory bank, and a second pattern when said processor accesses said second memory bank.

4. A computer system according to claim 1, wherein said memory module further comprises a plurality of memory modules, and said computer system further comprises a memory controller, said address bus coupling said central processing unit to said memory controller, and said memory controller to each of said plurality of memory modules.

5. A computer system according to claim 1, wherein said memory module further comprises:

a substrate;

a least one memory chip mounted on said substrate defining said first memory bank, each said at least one memory chip comprising a plurality of pins, one pin associated with a respective one of said plurality of pin assignments;

at least one memory chip mounted on said substrate defining said second memory bank, each said memory chip comprising a plurality of pins, one pin associated with a respective one of said plurality of pin assignments; and, a plurality of circuit traces, each circuit trace coupling one pin assignment from each said first and second memory banks to an associated one of said plurality of system bus connectors, wherein at least one of said plurality of bus connectors is coupled to non-identical pin assignments of said first and second memory banks and wherein said plurality of system bus connectors comprises a plurality of pads mounted along one edge of said substrate.

6. A computer system according to claim 5, wherein said substrate further comprises a first major surface and a second major surface, said first memory bank mounted to said first major surface of said substrate, and said second memory bank mounted to said second major surface of said substrate.

7. A computer system according to claim 6, wherein said first and second memory banks comprise the identical number and configuration of memory chips, and said memory chips mounted on said second major surface of said substrate align in register with said memory chips mounted on said first major surface.

8. A computer system according to claim 7, wherein said substrate further comprises a plurality of vias, each of said vias adjacent to, and coupling a select one of said plurality of pins on said memory chips on said first major surface to a select one of said plurality of pins on said memory chips on said second major surface.

9. A computer system according to claim 8, wherein:

said plurality of system bus connectors further comprise a plurality of address bus connectors;

each said memory chip comprises a plurality of address pins arranged bilaterally symmetrical;

each of said plurality of address pins is associated with a respective one of said plurality of pin assignments; and, said plurality of vias positioned on said substrate such that each via is adjacent to, and couples a select one of said plurality of address pins comprising a first pin assignment and positioned on said first major surface, to a select one of said plurality of address pins comprising a second pin assignment different from said first pin assignment, and located on said second major surface, to a respective one of said plurality of address bus connectors.

10. A computer system according to claim 9, wherein said system bus further comprises an address bus coupled between said central processing unit and said address bus connectors, wherein said central processing unit places an address on said address bus mapped to a first pattern corresponding with said pin assignments of said first memory bank when accessing said first memory bank, and said address mapped to a second pattern corresponding with said pin assignments of said second memory bank when accessing said second memory bank.

11. A computer system according to claim 10, wherein said address comprises a plurality of address bits, said first pattern comprises arranging said plurality of address bits in a sequence that aligns with the corresponding pin assignments of said address pins of said first memory bank, and said second pattern comprises arranging said plurality of address bits in a sequence that aligns with the corresponding pin assignments of said address pins of said second memory bank.

12. A computer system according to claim 8, wherein:

said plurality of system bus connectors further comprise a plurality of command bus connectors;

each said memory chip comprises a plurality of command pins arranged bilaterally symmetrical;

each of said plurality of command pins associated with a respective one of said plurality of pin assignments; and, said plurality of vias are arranged on said substrate such that each via is adjacent to, and couples a select one of said plurality of command pins comprising a first pin assignment and positioned on said first major surface, to a select one of said plurality of command pins comprising a second pin assignment different from said first pin assignment, and located on said second major surface, to a respective one of said plurality of command bus connectors.

13. A computer system according to claim 12, wherein said system bus further comprises a command bus coupled between said central processing unit and said command bus connectors, wherein said central processing unit places a command on said command bus mapped to a first pattern corresponding with said pin assignments of said first memory bank when accessing said first memory bank, and said command mapped to a second pattern corresponding with said pin assignments of said second memory bank when accessing said second memory bank.

14. A computer system according to claim 13, wherein said command comprises a plurality of command bits, said first pattern comprises arranging said plurality of command bits in a sequence that aligns with the corresponding pin assignments of said command pins of said first memory bank, and said second pattern comprises arranging said plurality of command bits in a sequence that aligns with the corresponding pin assignments of said command pins defining said second memory bank.

15. A computer system comprising:

a central processing unit comprising a processor and a basic input output system program;

a memory module, said memory module comprising a first memory bank of substantially identical memory chips, a second memory bank of substantially identical memory chips, and a plurality of system bus connectors;

said first and second memory banks each comprising a plurality of pin assignments, respective pin assignments of said first memory bank correspond to functions that are identical to functions corresponding to respective pin assignments on said second memory bank, each pin assignment from each said first and second memory banks coupled to an associated one of said plurality of system bus connectors, wherein at least one of said plurality of system bus connectors is coupled to non-identical pin assignments of said first and second memory banks, wherein said non-identical pin assignments have internal assignments for like functions in a bilaterally symmetrical arrangement;

a system bus coupling said central processing unit to said plurality of system bus connectors of said memory module, wherein said central processing unit places information on said system bus corresponding to a function associated with at said pin assignments, said information comprising a plurality of bits arranged in a bit pattern, said bit pattern arranged by said basic input output system to a first pattern corresponding with said pin assignments of said first memory bank when accessing said first memory bank, and said bit pattern arranged to a second pattern corresponding with said pin assignments of said second memory bank when accessing said second memory bank.

16. A computer system comprising:

a central processing unit comprising a processor and a basic input output system program;

a memory module, said memory module comprising a first memory bank of substantially identical memory chips, a second memory bank of substantially identical memory chips, and a plurality of system bus connectors, said first and second memory banks each comprising a plurality of system pin assignments, each of said plurality of system bus connectors connecting to an associated one of said plurality of system pin assignments of said first memory bank, and to an associated one of said plurality of system pin assignments of said second memory bank, wherein at least one of said plurality of system bus connectors connects to non identical system pin assignments of said first and second memory banks, wherein said non-identical pin assignments have internal assignments for like functions in a bilaterally symmetrical arrangements;

an operating system run by said processor; and, a system bus coupling said central processing unit to said plurality of system bus connectors of said memory module, wherein said operating system requests information from said processors, and said processor places said information on said system bus mapped by said basic input output system to a first pattern corresponding with said system pin assignments of said first memory bank when accessing said first memory bank, and mapped to a second pattern corresponding with said address pin assignments of said second memory bank when accessing said second memory bank.

17. A computer system comprising:

a central processing unit;

a memory module, said memory module comprising:

an address bus connector;

a first memory bank of substantially identical memory chips, and first memory bank comprising a plurality of address pin assignments coupled to said address bus connector in a first pattern; and a second memory bank of substantially identical memory chips, said second memory bank comprising a plurality of address pin assignments coupled to said address bus connector in a second pattern, wherein said first and second patterns are not identical such that an address at said address bus connector corresponds to a first address read by said first memory bank, and a second address different from said first address read by a said second memory bank, wherein said first address and said second address pin assignments have internal assignments for like functions in a bilaterally symmetrical arrangement; and, an address bus coupling said central processing unit to said address bus connector of said memory module, wherein said central processing unit places an address on said address bus mapped to correspond with said first pattern when accessing said first memory bank, and mapped to correspond with said second pattern when accessing said second memory bank.

18. A computer system comprising:

a central processing unit;

a system bus coupled to said central processing unit, said system bus comprising a plurality of system bus lines, each of said plurality of system bus lines corresponding to a unique system bus arrangement; and, a memory device comprising:

a system bus connector coupled to said system bus, said system bus connector comprising a plurality of bus line connectors, each of said plurality of bus line connectors arranged to correspond with a respective one of said system bus lines;

a first memory bank comprising a plurality of substantially identical memory chips and a plurality of pins, each said pin corresponding to a unique pin assignment, each of said address pin assignments connected to an associated one of said plurality of bus line connectors, such that said pin assignments of said first memory bank are identical to said system bus assignments; and, a second memory bank comprising a plurality of substantially identical memory chips and a plurality of pin assignments, each of said pin assignments connected to an associated one of said plurality of bus line connectors such that said pin assignments of said second memory bank are not identical to said system bus assignments, wherein said pin assignments of said first memory bank and said pin assignments of said second memory bank have internal assignments for like functions in a bilaterally symmetrical arrangement, wherein said central processing unit communicates with said memory device by placing information on said system bus, and reading information from said system bus, said information comprising a plurality of bits, each bit associated with one system bus line, and wherein said central processing unit is configured to encode information placed on said system bus to a coded pattern when interfacing with said second memory bank.

19. A computer system according to claim 18, wherein said coded pattern is defined by arranging said bits defining said information to correspond to said pin assignments of said second memory bank.

20. A computer system comprising:

a central processing unit, said central processing unit comprising a processor and a basic input output system program;

a memory module, said memory module comprising a first memory bank of substantially identical memory chips, a second memory bank of substantially identical memory chips, and a plurality of system bus connectors, said first and second memory banks each comprising a plurality of pin assignments, one pin assignment from each said first and second memory banks coupled to an associated one of said plurality of system bus connectors, wherein at least one of said plurality of bus connectors is coupled to non-identical pin assignments of said first and second memory banks, wherein said non-identical pin assignments have internal assignments for like functions in a bilaterally symmetrical arrangement; and, a system bus comprising a plurality of physical bus lines, each of said physical bus lines coupling said central processing unit to a respective one of said plurality of system bus connectors of said memory module, said system bus arranged to transfer information between said memory module and said central processing unit, said information comprising a plurality of logical bits, one logical bit per physical bus line, wherein said basic input output system is configured to arrange said information in a first pattern by ordering said plurality of logical bits to bit position that correspond to said pin assignments of said first memory bank, and said basic input output system is configured to arrange said information in a second pattern by ordering said plurality of logical address bits to bit positions that correspond to said address assignments of said second memory bank.

21. A computer system according to claim 20, wherein an assignment of at least one logical bit does not correspond with a physical bit assignment of a corresponding physical bus line, but said assignment of said at least one logical bit does correspond with an associated pin assignment to which said at least one logical bit is coupled.

22. A computer system comprising:

a central processing unit comprising a plurality of system bus connectors, each of said system bus contacts corresponding to a unique bus assignment;

a system bus comprising a plurality of system bus lines;

a remap multiplexer switchable from a first state wherein each of said system bus lines are coupled to a corresponding one of said system bus connectors, to a second state wherein at least two of said bus lines are swapped so as to couple to different ones of said system bus connectors; and a memory module coupled to said system bus, said memory module comprising a first memory bank of substantially identical memory chips, a second memory bank of substantially identical memory chips, and a plurality of system bus connectors, said first and second memory banks each comprising a plurality of pin assignments, one pin assignment from each said first and second memory banks coupled to an associated one of said plurality of system bus connectors, wherein at least one of said plurality of bus connectors is coupled to non-identical pin assignments of said first and second memory banks, wherein said non-identical pin assignments have internal assignments for like functions in a bilaterally symmetrical arrangement, and each of said plurality of system bus connectors coupling to a corresponding one of said system bus lines.

23. A computer system according to claim 22, wherein said remap multiplexer comprises first and second multiplexers, each of said first and second multiplexers comprising a first and second inputs, an output and a control input, wherein a first one of said system bus lines is coupled to said first input of said first multiplexer and to said second input of said second multiplexer, and a second one of said system bus lines is coupled to said second input of said first multiplexer and said first input of said second multiplexer, said first and second multiplexers configured to switch between a first state where said first one of said system bus lines appears at said output of said first multiplexer and said second one of said system bus lines appears at said output of said second multiplexer, and a second state where said second one of said system bus lines appears at said output of said first multiplexer and said first one of said system bus lines appears at said output of said second multiplexer based upon a control signal appearing at said control inputs.

24. A computer system according to claim 21, further comprising:

a memory controller coupled to said system bus, said memory controller connected to said control input of each of said first and second multiplexers, wherein said memory controller is configured to toggle said first and second multiplexers in said first state when said central processing unit communicates with said first memory bank, and said memory controller is configured to switch said first and second multiplexers to said second state when said central processing unit communicates with said second memory bank.

25. A computer system according to claim 24, wherein said remap multiplexer is coupled to said system bus between said central processing unit and said memory controller.

26. A computer system according to claim 24, wherein said remap multiplexer is coupled to said system bus between said memory controller and said memory device.

27. A computer system according to claim 24, wherein said remap multiplexer is integral with said memory controller.

28. A computer system according to claim 27, wherein said memory controller comprises a buffered system bus driver between said remap multiplexer and said memory device.

29. A computer system according to claim 28, wherein said memory controller comprises a buffered system bus register, wherein said remap multiplexer is coupled to said system bus between said buffered system bus register and said memory device.

30. A computer system according to claim 24, wherein said memory module further comprises:

a substrate;

at least one memory chip mounted on said substrate defining said first memory bank, each said memory chip comprising a plurality of pins, one pin associated with a respective one of said plurality of pin assignments;

at least one memory chip mounted on said substrate defining said second memory bank, each said memory chip comprising a plurality of pins, one pin associated with a respective one of said plurality of pin assignments; and, a plurality of circuit traces, each circuit trace coupling one pin assignment from each said first and second memory banks to an associated one of said plurality of system bus connectors, wherein at least one of said plurality of bus connectors is coupled to non-identical pin assignments of said first and second memory banks and wherein said plurality of system bus connectors comprises a plurality of pads mounted along one edge of said substrate.

31. A computer system according to claim 30, wherein said substrate further comprises a first major surface and a second major surface, said first memory bank mounted to said first major surface of said substrate, and said second memory bank mounted to said second major surface of said substrate.

32. A computer system according to claim 31, wherein said first and second memory banks comprise the identical number and configuration of memory chips, and said memory chips mounted on said second major surface of said substrate align in register with said memory chips mounted on said first major surface.

33. A computer system according to claim 32, wherein said substrate further comprises a plurality of vias, each of said vias adjacent to, and coupling a select one of said plurality of pins on said memory chips on said first major surface to a select one of said plurality of pins on said memory chips on said second major surface.

34. A computer system according to claim 33, wherein:

said plurality of system bus connectors further comprise a plurality of address bus connectors;

each said memory chip comprises a plurality of address pins arranged bilaterally symmetrical;

each of said plurality of address pins associated with a respective one of said plurality of pin assignments; and, said plurality of vias are arranged on said substrate such that each via is adjacent to, and coupling a select one of said plurality of address pins comprising a first pin assignment and positioned on said first major surface, to a select one of said plurality of address pins comprising a second pin assignment different from said first pin assignment, and located on said second major surface, to a respective one of said plurality of address bus connectors.

35. A computer system according to claim 34, wherein said system bus further comprises an address bus coupling said central processing unit, said memory controller, said remap multiplexer and said address bus connectors, wherein said central processing unit places an address on said address bus and said remap multiplexer maps said address to a first pattern corresponding with said pin assignments of said first memory bank when accessing said first memory bank, and said remap multiplexer maps said address to a second pattern corresponding with said pin assignments of said second memory bank when accessing said second memory bank.

36. A computer system according to claim 35, wherein said address comprises a plurality of address bits, said first pattern comprises arranging said plurality of address bits in a sequence that aligns with the corresponding pin assignments of said address pins of said first memory bank, and said second pattern comprises arranging said plurality of address bits in a sequence that aligns with the corresponding pin assignments of said address pins defining said second memory bank.

37. A computer system according to claim 35, wherein said remap multiplexer comprises a multiplexing circuit for each pair of bilaterally symmetrical address pins, each of said multiplexing circuits arranged to switchably swap address lines associated with said respective symmetrical address pins.

38. A computer system according to claim 35, wherein each said multiplexing circuit comprises first and second multiplexers, each of said first and second multiplexers comprising a first and second input, an output and a control input, wherein a first one of said address bus lines is coupled to said first input of said first multiplexer and to said second input of said second multiplexer, and a second one of said address bus lines is coupled to said second input of said first multiplexer and said first input of said second multiplexer, said first and second multiplexers switching between a non-switched state where said first one of said address bus lines appears at said output of said first multiplexer and said second one of said address lines appears at said output of said second multiplexer, and a switched state where said second one of said address bus lines appears at said output of said first multiplexer and said first one of said address bus lines appears at said output of said second multiplexer based upon a control signal appearing at said control inputs.

39. A computer system according to claim 37, wherein said memory controller has a control signal coupled to each said control inputs of said first and second multiplexers of each said multiplexing circuits, said memory controller arranged to switch said control inputs such that all said first and second multiplexers are in said non-switched state or all said first and second multiplexers are in said switched state.

40. A computer system according to claim 33, wherein:

said plurality of system bus connectors further comprise a plurality of command bus connectors;

each said memory chip comprises a plurality of command pins arranged bilaterally symmetrical;

each of said plurality of command pins associated with a respective one of said plurality of pin assignments; and, said plurality of vias arranged on said substrate such that each via is adjacent to, and coupling a select one of said plurality of command pins comprising a first pin assignment and positioned on said first major surface, to a select one of said plurality of command pins comprising a second pin assignment different from said first pin assignment, and located on said second major surface, to a respective one of said plurality of command bus connectors.

41. A computer system according to claim 40, wherein said system bus further comprises a command bus coupling said central processing unit, said memory controller, said remap multiplexer and said command bus connectors, wherein said central processing unit places a command on said command bus and said remap multiplexer maps said command to a first pattern corresponding with said pin assignments of said first memory bank when accessing said first memory bank, and said remap multiplexer maps said command to a second pattern corresponding with said pin assignments of said second memory bank when accessing said second memory bank.

42. A computer system according to claim 41, wherein said command comprises a plurality of command bits, said first pattern comprises arranging said plurality of command bits in a sequence that aligns with the corresponding pin assignments of said command pins of said first memory bank, and said second pattern comprises arranging said plurality of command bits in a sequence that aligns with the corresponding pin assignments of said command pins defining said second memory bank.

43. A computer system according to claim 41, wherein said remap multiplexer comprises a multiplexing circuit for each pair of bilaterally symmetrical command pins, each of said multiplexing circuits arranged to switchably swap command lines associated with said respective symmetrical command pins.

44. A computer system according to claim 43, wherein each said multiplexing circuit comprises first and second multiplexers, each of said first and second multiplexers comprising a first and second input, an output and a control input, wherein a first one of said command bus lines is coupled to said first input of said first multiplexer and to said second input of said second multiplexer, and a second one of said command bus lines is coupled to said second input of said first multiplexer and said first input of said second multiplexer, said first and second multiplexers switching between a non-switched state where said first one of said command bus lines appears at said output of said first multiplexer and said second one of said command bus lines appears at said output of said second multiplexer, and a switched state where said second one of said command bus lines appears at said output of said first multiplexer and said first one of said command bus lines appears at said output of said second multiplexer based upon a control signal appearing at said control inputs.

45. A computer system according to claim 44, wherein said memory controller has a control signal coupled to each said control inputs of said first and second multiplexers of each said multiplexing circuits, said memory controller arranged to switch said control inputs such that all said first and second multiplexers are in said non-switched state or all said first and second multiplexers are in said switched state.

46. An integrated circuit memory chip comprising:

a circuit package;

a first multiplexer contained within said circuit package of said integrated circuit memory chip, said first multiplexer comprising a first input, a second input, a control signal input, and an output;

a second multiplexer contained within said circuit package of said integrated circuit memory chip, said second multiplexer comprising a first input, a second input, a control signal input, and an output;

a first pin extending from said circuit package and coupled to said first input of said first multiplexer and said second input of said second multiplexer;

a second pin extending from said circuit package and coupled to said second input of said first multiplexer and said first input of said second multiplexer;

a first pin assignment coupled to said output of said first multiplexer;

a second pin assignment coupled to said output of said second multiplexer; and, a circuit coupled to said first and second pin assignments, wherein said first and second multiplexers are switchable between a first state wherein each said first and second multiplexers connect said first input to said output, and a second state wherein each said first and second multiplexers connect said second input to said output wherein said first and second pin assignments are bilaterally symmetric for like functions.

47. An integrated circuit memory chip according to claim 46, wherein said first and second pins are arranged on said circuit package in a bilaterally symmetrical arrangement.

48. An integrated circuit memory chip according to claim 46, further comprising a third pin extending from said circuit package and coupled to said control signal input of said first and second multiplexers.

49. An integrated circuit memory chip according to claim 46, wherein said control signal input of said first and second multiplexers are coupled to internal logic, said internal logic arranged to switch said first and second multiplexers between said first and second states.

50. An integrated circuit memory chip according to claim 49, wherein said internal logic comprises a mode register.

51. An integrated circuit memory chip comprising:

a circuit package;

a circuit contained within said circuit package;

a plurality of pins extending from said circuit package; and a remap multiplexer contained within said circuit package of said integrated circuit memory chip, said remap multiplexer comprising:

a first multiplexer comprising a first input, a second input, a control signal input, and an output, said first input coupling to a first one of said pins and said second input coupled to a second one of said pins;

a second multiplexer comprising a first input, a second input, a control signal input, and an output, said first input coupled to said second one of said pins and said second input coupled to said first one of said pins;

a first pin assignment coupling said output of said first multiplexers to said circuit; and a second pin assignment coupling said output of said second multiplexer to said circuit, wherein said remap multiplexer is switchable between a first state wherein each said first and second multiplexers connect said first input to said output, and a second state wherein each said first and second multiplexers connect said second input to said output wherein said first and second pin assignments are bilaterally symmetric for like functions.

52. An integrated circuit memory chip according to claim 51 wherein said control signal input of said first and second multiplexers are each coupled to a third one of said plurality of pins on said circuit package.

53. An integrated circuit memory chip according to claim 51, wherein said control signal inputs of said first and second multiplexers are coupled to internal logic, said internal logic arranged to switch said remap multiplexer between said first and second states.

54. An integrated circuit memory chip according to claim 53, wherein said internal logic comprises a mode register.

55. An integrated circuit memory chip comprising:

a circuit package;

a plurality of pins extending from said circuit package;

an memory circuit internal to said circuit package;

a plurality of pin assignments coupled to said memory circuit; and a remap multiplexer contained within said circuit package of said integrated circuit memory chip, said remap multiplexer coupling said plurality of pins to said plurality of internal pin assignments, and comprising a control input, wherein said control signal is switchable from a first state where said remap multiplexer couples said plurality of pins to said internal pin assignments, to a second state where said remap multiplexer routes at least one of said pins to a different one of said internal pin assignments wherein said internal pin assignments are bilaterally symmetric for like functions.

56. A memory module comprising:

a substrate;

at least one memory chip mounted on said substrate defining a first memory bank, each said at least one memory chip comprising:

a circuit package within said memory chip;

a plurality of pins extending from said circuit package;

an memory circuit internal to said circuit package;

a plurality of pin assignments coupled to said memory circuit; and a remap multiplexer contained within said circuit package of said memory chip, said remap multiplexer coupling said plurality of pins to said plurality of internal pin assignments, and comprising a control inputs, wherein said control signal is switchable from a first state where said remap multiplexer couples said plurality of pins to said internal pin assignments, to a second state where said remap multiplexer routes at least one of said pins to a different one of said internal pin assignments;

at least one additional memory chip substantially identical to said at least one memory chip mounted on said substrate defining a second memory bank, said additional memory chip comprising:

a circuit package within said at least one additional memory chip;

a plurality of pins extending from said circuit package;

an memory circuit internal to said circuit package;

a plurality of pin assignments coupled to said memory circuit; and a remap multiplexer contained within said circuit package of said at least one additional memory chip, said remap multiplexer coupling said plurality of pins to said plurality of internal pin assignments, and comprising a control input, wherein said control signal input is switchable from a first state where said remap multiplexer couples said plurality of pins to said internal pin assignments, to a second state where said remap multiplexer routes at least one of said pins to a different one of said internal pin assignments, wherein said pin assignments of said first memory bank and said pin assignments of said second memory bank have bilaterally symmetric internal assignments for like functions;

a plurality of pads mounted along one edge of said substrate; and a plurality of circuit traces, each circuit trace coupling one pad to said first and second memory banks.

57. A memory module according to claim 56, wherein said substrate further comprises a first major surface and a second major surface, said first memory bank mounted to said first major surface of said substrate, and said second memory bank mounted to said second major surface of said substrate.

58. A memory module according to claim 57, wherein said first and second memory bank; comprise the identical number and configuration of memory chips, and said memory chips mounted on said second major surface of said substrate align in register with said memory chips mounted on said first major surface.

59. A memory module according to claim 58, wherein said substrate further comprises a plurality of vias, each of said vias adjacent to, and coupling a select one of said plurality of pins on said memory chips on said first major surface to a select one of said plurality of pins on said memory chips on said second major surface.

60. A memory module according to claim 59, wherein:

each said memory chip comprises a plurality of address pins arranged bilaterally symmetrical;

each of said plurality of address pins is associated with a respective one of a plurality of internal address pin assignments; and, said plurality if vias positioned on said substrate such that each via is adjacent to, and couples a select one of said plurality of address pins comprising a first pin assignment and positioned on said first major surface, to a select one of said plurality of address pins comprising a second pin assignment different from said first pin assignment, and located on said second major surface, to a respective one of said plurality of circuit traces, and wherein said remap multiplexers in said first bank are switched to said first state, and said remap multiplexers in said second bank are switched to said second state.

61. A memory module according to claim 59, wherein:

each said memory chip comprises a plurality of command pins arranged bilaterally symmetrical;

each of said plurality of command pins associated with a respective one of a plurality of internal control pin assignments; and, said plurality of vias are arranged on said substrate such that each via is adjacent to, and couples a select one of said plurality of command pins comprising a first pin assignment and positioned on said first major surface, to a select one of said plurality of command pins comprising a second pin assignment different from said first pin assignment, and located on said second major surface, to a respective one of said plurality of circuit traces, and wherein said remap multiplexers in said first bank are switched to said first state, and said remap multiplexers in said second bank are switched to said second state.

62. An integrated circuit memory chip comprising:

a circuit package; p1 a first multiplexer contained within a memory controller of said circuit package said first multiplexer comprising a first input, a second input, a control signal input, and an output;

a second multiplexer contained within a memory controller of said circuit package said second multiplexer comprising a first input, a second input, a control signal input, and an output;

a first pin extending from said circuit package and coupled to said first input of said first multiplexer and said second input of said second multiplexer;

a second pin extending from said circuit package and coupled to said second input of said first multiplexer and said first input of said second multiplexer;

a first pin assignment coupled to said output of said first multiplexer;

a second pin assignment coupled to said output of said second multiplexer; and, a circuit coupled to said first and second pin assignments, wherein said first and second multiplexers are switchable between a first state wherein each said first and second multiplexers connect said first input to said output, and a second state wherein each said first and second multiplexers connect said second input to said output wherein said first and second pin assignments are bilaterally symmetric for like functions.

63. An integrated circuit memory chip comprising:

a circuit package;

a circuit contained within said circuit package;

a plurality of pins extending from said circuit package; and a remap multiplexer contained within a memory controller of said circuit package, said remap multiplexer comprising:

- a first multiplexer comprising a first input, a second input, a control signal input, and an output, said first input coupling to a first one of said pins and said second input coupled to a second one of said pins;
- a second multiplexer comprising a first input, a second input, a control signal input, and an output, said first input coupled to said second one of said pins and said second input coupled to said first one of said pins;
- a first pin assignment coupling said output of said first multiplexer to said circuit; and,
- a second pin assignment coupling said output of said second multiplexer to said circuit, wherein said remap multiplexer is switchable between a first state wherein each said first and second multiplexers connect said first input to said output, and a second state wherein each said first and second multiplexers connect said second input to said output wherein said first and second pin assignments are bilaterally symmetric for like functions.

64. An integrated circuit memory chip comprising:

a circuit package;

a plurality of pins extending from said circuit package;

an memory circuit internal to said circuit package;

a plurality of pin assignments coupled to said memory circuit; and a remap multiplexer contained within said memory circuit of said circuit package, said remap multiplexer coupling said plurality of pins to said plurality of internal pin assignments, and comprising a control input, wherein said control signal is switchable from a first state where said remap multiplexer couples said plurality of pins to said internal pin assignments, to a second state where said remap multiplexer routes at least one of said pins to a different one of said internal pin assignments wherein said internal pin assignments are bilaterally symmetric for like functions.

* * * * *

UNITED STATES PATENT AND TRADEMARK OFFICE

CERTIFICATE OF CORRECTION

PATENT NO. : 6,944,694 B2
APPLICATION NO. : 09/903161
DATED : September 13, 2005
INVENTOR(S) : Pax It is certified that error appears in the above-identified patent and that said Letters Patent is hereby corrected as shown below:

Col. 1, line 9 "unil" should read --unit.--;
Col. 1, line 46 "constrcted" should read --constructed--;
Col. 3, line 28 "AJtematively," should read --Alternatively,--;
Col. 4, line 3 "1048" should read --104B--;
Col. 4, line 10 "10" should read --110--;
Col. 4, line 54 "infomation" should read --information--;
Col. 5, line 67 "206," should read --206.--;
Col. 7, line 66 "mnemory" should read --memory--;
Col. 13, line 16 "arrangements;" should read --arrangement;--;
Col. 13, line 21 "processors," should read --processor,--;
Col. 13, line 34 “and” should read --said--;
Col. 13, line 45 "a" should be deleted;
Col. 13, line 62 "arrangement;" should read --assignment;--;
Col. 14, line 30 "arranging" should read --rearranging--;
Col. 14, line 61 "position" should read --positions--;
Col. 17, line 45 "address" should read --address bus--;
Col. 19, line 52 "multiplexers" should read --multiplexer--;
Col. 20, line 38 "inputs," should read --input,--;
Col. 21, line 12 "bank;" should read --banks--;
Col. 21, line 59 "p1" should be deleted.

Signed and Sealed this

First Day of August, 2006

JON W. DUDAS
*Director of the United States Patent and Trademark Office*